US008932726B2

(12) United States Patent
Paolilli et al.

(10) Patent No.: US 8,932,726 B2
(45) Date of Patent: *Jan. 13, 2015

(54) HIGH BARRIER HEAT SEALABLE FILM WITH LINEAR TEAR PROPERTIES

(75) Inventors: Tracy A. Paolilli, East Greenwich, RI (US); Scott Narkevicius, South Kingstown, RI (US); Harold Egon Koehn, North Kingstown, RI (US); Matthew H. Brown, Wakefield, RI (US)

(73) Assignee: Toray Plastics (America), Inc., N. Kingstown, RI (US)

( * ) Notice: Subject to any disclaimer, the term of this patent is extended or adjusted under 35 U.S.C. 154(b) by 235 days.

This patent is subject to a terminal disclaimer.

(21) Appl. No.: 13/222,709

(22) Filed: Aug. 31, 2011

(65) Prior Publication Data

US 2012/0028058 A1 Feb. 2, 2012

Related U.S. Application Data

(63) Continuation-in-part of application No. 13/193,095, filed on Jul. 28, 2011.

(60) Provisional application No. 61/368,796, filed on Jul. 29, 2010.

(51) Int. Cl.
| B32B 15/04 | (2006.01) |
| B32B 27/00 | (2006.01) |
| B32B 27/08 | (2006.01) |
| B29C 47/06 | (2006.01) |
| B29C 47/00 | (2006.01) |
| B29C 47/02 | (2006.01) |
| B29K 23/00 | (2006.01) |
| B29K 29/00 | (2006.01) |

(52) U.S. Cl.
CPC ........... B29C 47/065 (2013.01); B29C 47/0004 (2013.01); B29C 47/0021 (2013.01); B29C 47/0057 (2013.01); B29C 47/067 (2013.01); B29C 47/025 (2013.01); B29K 2023/0633 (2013.01); B29K 2023/086 (2013.01); B29K 2023/12 (2013.01); B29K 2029/04 (2013.01); B29K 2995/0067 (2013.01)
USPC ............................ 428/500; 428/457; 428/515

(58) Field of Classification Search
None
See application file for complete search history.

(56) References Cited

U.S. PATENT DOCUMENTS

| RE30,726 E | 9/1981 | Otten et al. |
| 4,291,085 A | 9/1981 | Ito et al. |
| 4,308,084 A | 12/1981 | Ohtusuki et al. |
| 4,464,438 A * | 8/1984 | Lu ................... 428/516 |
| 4,781,294 A | 11/1988 | Croce |
| 4,834,245 A | 5/1989 | Ohga et al. |
| 4,903,841 A | 2/1990 | Ohsima et al. |
| 5,153,074 A | 10/1992 | Migliorini |
| 5,443,765 A | 8/1995 | Yoshimura et al. |
| 5,491,023 A * | 2/1996 | Tsai et al. ................ 428/349 |
| 5,527,608 A | 6/1996 | Kemp-Patchett et al. |
| 5,786,050 A | 7/1998 | Otsuka et al. |
| 6,110,549 A | 8/2000 | Hamada et al. |
| 6,248,442 B1 | 6/2001 | Kong et al. |
| 6,495,266 B1 | 12/2002 | Migliorini |
| 6,541,086 B2 | 4/2003 | Moteki et al. |
| 6,601,370 B2 | 8/2003 | Colombo et al. |
| 6,719,678 B1 | 4/2004 | Stern |
| 6,773,818 B2 * | 8/2004 | Cretekos et al. ........... 428/461 |
| 6,939,919 B2 | 9/2005 | Tau et al. |
| 8,431,234 B2 | 4/2013 | Koehn et al. |
| 2004/0072004 A1 | 4/2004 | Migliorini et al. |
| 2006/0257652 A1 * | 11/2006 | Su ..................... 428/355 EN |
| 2008/0051518 A1 | 2/2008 | Sakamoto |
| 2008/0101733 A1 | 5/2008 | Fenn-Barrabass et al. |
| 2008/0292225 A1 | 11/2008 | Dayrit et al. |
| 2010/0040875 A1 | 2/2010 | Patel et al. |
| 2010/0055429 A1 | 3/2010 | Lee et al. |

FOREIGN PATENT DOCUMENTS

| EP | 1 803 772 | 7/2007 |
| EP | 1 849 826 | 10/2007 |
| WO | WO-99/23139 | 5/1999 |
| WO | WO-2010/047906 | 4/2010 |

OTHER PUBLICATIONS

International Search Report and Written Opinion mailed Oct. 16, 2012, directed to International Application No. PCT/US 11/50028; 8 pages.
International Search Report and Written Opinion mailed Dec. 16, 2011, directed to International Patent Application No. PCT/US11/45771; 10 pages.
Canadian Office Action dated Oct. 23, 2013, directed to CA Application No. 2,803,285; 3 pages.
Koehn et al., U.S. Office Action mailed Aug. 8, 2013, directed to U.S. Appl. No. 13/193,095; 8 pages.
Canadian Office Action dated Jul. 14, 2014, directed to CA Application No. 2,803,285; 7 pages.
Koehn et al., U.S. Office Action mailed Apr. 21, 2014, directed to U.S. Appl. No. 13/193,095; 9 pages.
Extended European Search Report dated Apr. 17, 2014, directed to EP Application No. 11813205.9; 6 pages.
Koehn et al., U.S. Office Action mailed Oct. 16, 2014, directed to U.S. Appl. No. 13/193,095; 6 pages.

* cited by examiner

Primary Examiner — Sheeba Ahmed
(74) Attorney, Agent, or Firm — Morrison & Foerster LLP

(57) ABSTRACT

A monoaxially oriented film including a metallized layer; a gas barrier layer; and a propylene-based random copolymer and at least about 3 wt % of a low density polyethylene which is oriented at least about 2.5 times in one direction and exhibits excellent linear directional tear properties parallel to the orientation direction and excellent heat seal performance in terms of high heat seal strengths and low seal initiation temperature. This film formulation and orientation is suitable for pouch applications requiring high gas and moisture barrier, an "easy-tear" linear tear feature, and excellent hermetic seal properties.

21 Claims, No Drawings

HIGH BARRIER HEAT SEALABLE FILM WITH LINEAR TEAR PROPERTIES

CROSS-REFERENCE TO RELATED APPLICATIONS

This application is a continuation-in-part application of U.S. application Ser. No. 13/193,095, filed Jul. 28, 2011, which claims the benefit of U.S. Provisional Application Ser. No. 61/368,796, filed Jul. 29, 2010, the contents of which are incorporated herein by reference.

FIELD OF INVENTION

This invention involves the blending of an incompatible polymer such as low density polyethylene (LDPE) with propylene-based random copolymers and/or terpolymers to give a film layer that, when mono-oriented, will display the tendency to fibrillate. The film also includes a gas barrier layer and a vapor-deposited metal layer that is applied upon the gas barrier layer to achieve a high gas barrier, straight-line tearable, high seal strength, and low seal temperature initiation packaging film.

BACKGROUND OF THE INVENTION

Polymer films are commonly utilized to produce containers, such as pouches, that are used to contain, transport, and preserve a variety of substances, including but not limited to, foods. These containers are commonly created using a heat sealing process, in which high pressure and temperature is applied to opposing polymer films or laminates to join them together. Through this sealing process, the shelf life of the packaged material is extended through the prevention of contamination of the substance from such processes as microbial contamination or an influx of gases such as oxygen (which can cause rancidity of some packaged food products via oxidation of fats and oils) or water vapor (which can cause staleness of some packaged food products via moisture retention or loss). The temperature at which this seal is created can be relatively high depending on the melting or softening point of the polymer material used as a sealant. The seal initiation temperature (SIT) of the sealant material can be important to commercial packagers since it will influence the operating conditions (e.g. temperature set points) of the packaging machine as well as packaging speeds due to thermal transfer/residence time for the heat from the sealer jaws to soften and fuse the package's sealant material. In general, a lower SIT is desirable as it can allow lower temperature settings for the heated jaw sealers of the packaging machine. By reducing this seal initiation temperature, the process can be made to be faster, more economical, use less electricity, and be more efficient. In addition, lower sealing temperatures may reduce the risk of thermal deformation or distortion of the packaging material, resulting in more attractive pouch appearance on the store shelf.

A typical packaging pouch is a laminate of several films, typically constructed of: A film that can be printed for the marketing of the food product; a barrier film to inhibit the diffusion of oxygen and moisture and thus prolong the shelf-life of the product; and a sealant film which provides hermetic seals that also help prevent ingress of gases or microbes that could shorten the shelf-life of the product or cause spoilage. In some cases, the barrier film and the sealant film can be combined into a single film that provides both functions of gas barrier as well as sealability. Typically, this sealant film is a non-oriented, cast polypropylene or polyethylene-based film. The polyethylene film can also be made via blown film processes well-known in the art.

However, the high seal strengths required for some pouch packaging also make it difficult for the consumer to open the pouch by hand, especially if the retort package is made of all-polymeric films. Scissors or sharp implements must typically be used to open such pouches. To make the pouches more user-friendly, notches can be used to enable the consumer to easily initiate a tear and thus open the pouch. However, such a tear can easily result in "zippering" of the pouch whereby the tear is not uniformly parallel to the top edge of the pouch but can become vertical or diagonal to the top of the pouch and cause a potential loss or spillage of the contents during opening. To rectify this, some solutions involve perforating a tear-line with the notch in order to keep the tear directionally parallel to the top of the pouch and thus prevent zippering. These perforations are often accomplished using mechanical perforators or lasers. Some concerns using perforation techniques are not only additional cost, but also the potential compromising of barrier properties since these techniques are essentially making physical holes in the pouch laminate.

Another method to impart directional tear properties could be to orient the cast polypropylene film typically used in pouch applications. However, the process of orienting such a film—either uni-axially or biaxially—typically diminishes the seal properties in that the seal initiation temperature (SIT) of the film is raised and the overall seal strengths are weaker. Without being bound by any theory, this is believed to be due to the fact that the orientation process aligns the amorphous regions into a more ordered configuration, raising the Tg of the film, and thus, resulting in poorer seal properties. This is why unoriented cast polypropylene works well as a sealant film versus, for example, biaxially oriented polypropylene film (BOPP) which generally functions poorly as a sealant film. (This is assuming that no coextruded highly amorphous/low crystallinity random copolymer heat sealable resins are used as part of the BOPP film.) There is typically a minimum and maximum range for uni-axial orientation stretching in the machine direction (MDX): under 2.0 MDX, the film usually suffers from uneven stretching mark defects and over 7.0 MDX, processing stability can be difficult to maintain, as the film may be prone to breakage at this high orientation rate.

Although crystalline propylene homopolymer and blends of crystalline propylene homopolymer with impact ethylene-propylene copolymers will display acceptable linear tear properties when oriented sufficiently in one direction, the higher content comonomer polypropylenes generally do not show acceptable linear tear properties by themselves. The reason for the use of copolymer and terpolymers is to get acceptably low seal initiation temperatures. Low seal initiation temperatures allow for faster sealing speeds and use of certain lamination films that may melt or deform if too high a sealing temperature is used. Sealing films made with crystalline propylene homopolymers as a component of the film, however, often show a higher-than-desired SIT and adjustments to raise sealer jaw temperature settings and/or to lower packaging machine line speeds to accommodate such homopolymer-containing sealing films are often needed. Although such homopolymer-containing films can demonstrate excellent directional or linear tear properties with an amount of mono-orientation, SIT is often higher than desired. Although propylene copolymers can demonstrate excellent SIT, they often fail to exhibit satisfactory directional or linear tear properties when mono-oriented.

As previously stated, a typical packaging pouch can include three separate films: an outer film for printing graphics and/or having a controlled or low coefficient of friction for machine handling; an intermediate film including gas barrier properties which may or may not also include a metallized layer; and an inner film for heat sealability purposes.

Typically, the processing steps to combine these three films require two steps: one processing (or "converting") step is used to adhesively combine two of the substrate films; a second processing step is used to combine the previously adhered two plies with the third ply. The order of the films to be adhesively combined can be varied, but typically one can choose to adhere the print film to the barrier film; then adhere the sealant film to the previously combined films. The adhesive can be a two-part adhesive either solvent or water-borne, or can be a solventless adhesive such as molten low density polyethylene or ultra-violet or radiation-curable adhesives well-known in the art. Such adhesives can be used for both processing steps or a combination can be used for each processing step respectively.

It can be desirable and cost-effective to combine the gas barrier properties of the intermediate film with the heat sealable properties of the inner film and thus reduce a three-ply laminate packaging structure to a two-ply laminate structure. Such a reduction in plies can be a cost-savings not only in raw material sourcing (i.e. inventorying only two film substrates instead of three; using less material overall), but also as savings in using fewer processing steps. Instead of using two processing (or "converting") steps to adhesively combine the three films, only one processing step is needed to combine only two films.

U.S. application Ser. No. 12/542,385 describes a linear or directional tear retortable sealant film using blends of metallocene-catalyzed propylene-butene elastomers and ethylene-propylene impact copolymers which are monoaxially oriented at least 4 times in the machine direction. Typical seal initiation temperatures reported are about 320° F. (160° C.) or higher. This reference is incorporated herein in its entirety.

U.S. Pat. No. RE30,726 describes a film including blended low density polyethylene and ionomer resins which is blow-extruded to form a film with linear tear properties in the direction of the extrusion.

U.S. Pat. No. 4,781,294 describes a tear-oriented package with one wall formed from foamed polypropylene and another from tear resistant polyester film or another such substance. However, zones of weakening, such as perforations, are used to provide easy opening of the packaging.

U.S. Pat. No. 6,248,442 describes the use of a multilayered film that includes a layer of LLDPE which is biaxially oriented through the process of machine direction orientation. This produces a bag which can be torn unidirectionally and which contains a resealable zipper.

U.S. Pat. No. 6,601,370 describes a process for forming a reclosable film package with a straight tear by attaching a nylon or polyester layer to a sealant layer, such as polyethylene. This involves two layers of overlapping films which propagate a tear along a linear path when sufficient force is applied.

U.S. Pat. No. 6,939,919 describes a blend of polypropylene and polyethylene with enhanced properties, of which a majority is polyethylene with a minority of the blend being polypropylene. However, this patent does not cite any linear tear properties of the resultant blend.

U.S. Pat. No. 6,541,086 describes a retort package design using an oriented polymer outer film (suitable for printing), an aluminum foil as a barrier film, a second oriented intermediate polymeric film, and a non-oriented polyolefin for the sealant film. Easy-tear functionality is added by surface-roughening the two oriented polymer films and overlapping them in a particular formation. The particular specific order of laminating the films and the surface-roughening by sandpaper provides for easy-tear properties and presumably directional tear, but this process involves additional films and extra steps to accomplish the desired tear properties.

U.S. Pat. No. 6,719,678 describes a retort package design using multiple film layers whereby the intermediate layers ("burst resistant layer") are scored by a laser such that the score lines provide an easy-tear feature and a directional tear feature.

U.S. Pat. No. 4,903,841 describes a retort package design that utilizes non-oriented cast polypropylene films as the sealable layer, which is surface-roughened or scored in a particular manner so as to impart directional tear properties.

U.S. Pat. No. 4,291,085 describes a retort package design using a non-drawn, non-oriented cast crystalline polypropylene film as the sealable layer with specific crystalline structure and orientation of the crystalline structures which must be less than 3.0. There are no directional tear properties cited.

U.S. Pat. No. 5,786,050 describes an "easy opening" pouch design which has as the inner ply (which contacts the pouch's contents) a sealant film including linear low density polyethylene; an intermediate layer composed of an oriented polyolefin with an MD/TD ratio of greater than 2; and an outermost layer of biaxially oriented PET or nylon film. The inner ply sealant of linear low density polyethylene is non-oriented. The specific orientation ratios of the intermediate film impart easy-tear properties.

U.S. Pat. No. 4,834,245 describes a pouch design having a "tearing zone" using a monoaxially oriented film with a pair of notches aligned with the tearing direction and the direction of orientation of the film. The monoaxially oriented film that imparts the "tearing zone" is on the outside of the pouch and does not contact the pouch contents and is not designed or considered to be appropriate for heat-sealability.

U.S. patent application Ser. No. 11/596,776 describes a pouch design including at least one uni-directionally stretched film. The preferred embodiments describe a uni-directionally stretched polypropylene film or uni-directionally stretched polyethylene terephthalate film which imparts the easy-tear property. The application is silent as to the sealing properties of these layers or even which layer should be the sealant film.

U.S. Pat. No. 6,110,549 describes a sealant resin composition for a retort packaging film including high density polyethylene as the main resin component and a metallocene-catalyzed linear low density polyethylene. This films do not exhibit any linear tear properties or gas barrier properties.

U.S. Pat. No. 5,153,074 describes metallized high barrier polymer films using a combination of maleic acid anhydride-modified propylene homopolymers or copolymers with ethylene vinyl alcohol copolymer (EVOH) and an aluminum deposited layer upon the EVOH layer. This patent is directed towards biaxially oriented films which do not exhibit linear tear features.

U.S. Pat. No. 5,527,608 describes a four-layer heat sealable film suitable for metallizing which exhibits high heat seal strength and hermeticity. A "dual core" layer including a polypropylene layer and an ethylene-propylene block copolymer layer is described. The EP block copolymer layer is a very thick layer (8 μm), being nearly half the thickness of the overall substrate. A thick heat sealable layer (ca. 4 μm) is coextruded onto the EP block copolymer side and an optional fourth layer of HDPE (high density polyethylene) is coextruded on the polypropylene side as a metal adhesion skin layer. These films are biaxially oriented and can be expensive to produce because of the thick layers of EP block copolymer and heat sealant resin as well as requiring four-layer coextrusion equipment. These films also do not have linear tear features.

U.S. Pat. No. 4,308,084 describes an aluminum substrate laminated to a polyolefin film using an adhesive combining a polyolefin with maleic anhydride and aluminum hydroxide. Such a laminate provides heat sealability and gas barrier functionality. However, this invention does not provide linear tear properties, nor do either of the substrates used provide both heat sealability and gas barrier.

SUMMARY OF THE INVENTION

The above issues of making a heat sealable film with excellent sealing characteristics such as a low seal initiation temperature with excellent linear tear properties without using mechanical or laser perforation schemes or surface roughening and/or scoring methods and excellent gas and moisture barrier properties are addressed. The inventors have found a blend that balances these attributes for linear tear with low seal initiation temperature. The linear tear property and low SIT is enhanced via the addition of about 3 to 65 wt % of low density polyethylene (LDPE) with about 97 to 35 wt % of a propylene random copolymer. The LDPE has a degree of incompatibility with the propylene-based copolymers and, when oriented in one direction, this incompatible blend exhibits excellent linear tear properties. The directional tear property is imparted via machine direction (MD) orientation of the cast film from about 2.5 times to 7 times original length. This combination of MD orientation and resin formulation provides excellent directional tear properties without compromising the high seal strength and hermetic seal properties required for pouches. A gas barrier layer is added to one side of the film and can be metallized to provide excellent gas and moisture barrier properties.

One embodiment is a monoaxially oriented film including a single layer (A) of a propylene random copolymer blended with an amount of low density polyethylene homopolymer (LDPE). This layer (A) formulation is suitable for heat sealable applications, particularly for packaging applications. Another embodiment may include a laminate film in which a second polyolefin resin-containing layer (B) is coextruded on one side of the layer (A). This second polyolefin resin-containing layer may be considered a core or base layer to provide the bulk strength of the laminate film. Preferably, this core layer (B) may also include an ethylene-propylene impact copolymer. Furthermore, in another embodiment, the laminate could further include a third polyolefin resin-containing layer (C) on the second polyolefin resin-containing core layer (B) opposite the side with the heat sealable layer (A). This third layer could function as a layer whose exposed surface could be made suitable for receiving barrier coatings, metallizing, printing, or receptive for adhesives. In addition, further embodiments can be contemplated in which intermediate layers may be interposed between the core and outer layers.

Preferably, the heat sealable layer (A) includes a majority component of a propylene random copolymer. The propylene-based random copolymer may be a copolymer of propylene with ethylene, butene, or combinations of both (i.e. ethylene-propylene-butene copolymer). The propylene-based random copolymer may be catalyzed via Zieglar-Natta or by metallocene processes. The propylene-based random copolymer may be a higher molecular weight copolymer (e.g. ca. 350,000 $M_w$ or higher) or a lower molecular weight one such as an elastomer or plastomer (e.g. less than 350,000$M_w$ or about 5000-100,000 $M_w$). The other component of this blend is the addition of an amount of low density polyethylene.

Typically, the LDPE is a minority component, including about 3-30 wt % of the layer (A), but it can include up to 65 wt % of the layer (A).

This heat sealable propylene copolymer/LDPE resin-containing layer (A) can also optionally include an antiblock component selected from amorphous silicas, aluminosilicates, sodium calcium aluminum silicates, glass microspheres, talcs, micas, minerals, crosslinked silicone polymers, and polymethylmethacrylates to aid in machinability and winding. It can also be contemplated to discharge-treat one side of the layer (A) in order to enhance that side for laminating via adhesives, for receiving coatings, for metallizing, etc. Discharge-treating can be done by any of several means well known in the art, such as corona, flame, plasma, or discharge-treatment in a controlled atmosphere of selected gases.

This film layer (A) is then monoaxially oriented from about 2.5-7 times in the machine direction, preferably 3-7 times, and more preferably 4.0 to 6.0 times. This monoaxial orientation imparts a directional tear property to the film. The resin formulation of the (A)-layer provides excellent seal initiation, seal strengths, and hermetic seal properties after monoaxial orientation, suitable for many pouch applications.

In the embodiment of a 2-layer laminate film structure, the (A)-layer could include a sealant layer on one side of a core layer (B). Preferably, this core layer (B) includes a polyolefin resin-containing layer which in turn, includes a propylene homopolymer or propylene copolymer. More preferable is an ethylene-propylene impact copolymer. The (A)-layer can be the same thickness as the (B) core layer, but preferably is thinner than the (B)-layer, about 5-50% of the total thickness of the (A) and (B) layers combined, more preferably 10-30% of the total thickness of the laminate film structure (A) and (B) layers combined. This core polyolefin resin-containing layer can also include an antiblock component selected from amorphous silicas, aluminosilicates, sodium calcium aluminum silicates, glass microspheres, talcs, micas, minerals, crosslinked silicone polymers, and polymethylmethacrylates to aid in machinability and winding. The core layer (B) opposite the heat sealable layer (A) can be discharge treated in order to enhance that side for laminating via adhesives, for receiving coatings, for metallizing, etc. Discharge-treating can be done by any of several means well known in the art, such as corona, flame, plasma, or discharge-treatment in a controlled atmosphere of selected gases.

In the embodiment of a 3-layer laminate film structure, a third layer (C) could be disposed on the side of the core layer (B) opposite the heat sealable layer (A) and preferably includes a polyolefin resin-containing layer which in turn, includes a polyolefin selected from propylene homopolymer, copolymers, terpolymers, polyethylene, maleic anhydride-grafted polyolefins, and combinations thereof. This third polyolefin resin-containing layer can also include an antiblock component selected from amorphous silicas, aluminosilicates, sodium calcium aluminum silicates, glass microspheres, talcs, micas, minerals, crosslinked silicone polymers, and polymethylmethacrylates to aid in machinability and winding. The third polyolefin layer can also be a discharge-treated layer having a surface for lamination, metallizing, printing, or coating with adhesives or inks or barrier coatings as described previously.

In the case of a film structure including only one layer, such as the heat sealable layer (A), as mentioned previously, it can be contemplated to discharge-treat one side of this layer for lamination, metallizing, printing, or coating, while leaving the opposite side untreated in order to maintain heat sealable properties. Discharge-treating this layer can result in the treated side having a narrower seal range due to crosslinking of the ethylene and/or butene constituents of the blend. Thus, at least one side must be left untreated in order to obtain the full and useful heat seal range. In the case of a 2-layer (or more) laminate structure wherein the sealable layer (A) is contiguous with a polyolefin core layer (B), it is preferable to discharge-treat the side of the core layer opposite the sealable layer (A) for purposes of laminating, printing, metallizing, coating, etc.

Discharge-treatment in the above embodiments can be accomplished by several means, including but not limited to corona, flame, plasma, or corona in a controlled atmosphere of selected gases. Preferably, in one variation, the discharge-treated surface has a corona discharge-treated surface formed in an atmosphere of $CO_2$ and $N_2$ to the exclusion of $O_2$. The laminate film embodiments could further include a vacuum-deposited metal layer on the discharge-treated layer's surface. Preferably, the metal layer has a thickness of about 5 to 100 nm, has an optical density of about 1.5 to 5.0, and includes aluminum. In one variation, the laminate film is an extruded laminate film.

In yet another embodiment, monoaxially oriented polyolefin films with a heat sealable layer of blends of propylene random copolymers, elastomers, and plastomers with low density polyethylene to enhance heat sealing properties for flexible packaging purposes are provided. An additional embodiment provides laminate structures of the heat sealable polyolefin blend layers for heat sealable applications in flexible packaging.

Preferably, the monoaxially oriented film is produced via extrusion of the heat sealable layer blend through a die whereupon the molten film layer is quenched upon a chilled casting roll system or casting roll and water bath system and subsequently oriented in the machine direction and annealed or heat-set to minimize thermal shrinkage into a thermally, dimensionally stable film.

In the embodiments of a multi-layer film, the laminate film is produced via coextrusion of the heat sealable layer blend and the core layer and/or other layers through a compositing die whereupon the molten multilayer film structure is quenched upon a chilled casting roll system or casting roll and water bath system and subsequently oriented in the machine direction and annealed or heat-set into a multi-layer film.

In the above embodiments, a barrier layer is formed upon one surface of the monoaxially oriented film, preferably upon the discharge-treated surface of the film. The barrier layer can be formed by various means well-known in the art such as coextrusion or aqueous or solvent solution-coating either in-line after monoaxial orientation and prior to rewinding or off-line on a stand-alone coater. The method of applying the barrier layer is dependent upon the barrier layer's material properties and chemistries. Suitable barrier materials include but are not limited to: EVOH, polyvinyl alcohol (PVOH), polyhydroxyaminoethers, polyvinyl butyrate, polyvinyl amine, or blends thereof. It is also desirable to incorporate a tie-resin or tie-layer or primer layer to improve bonding of the barrier layer to the monoaxially oriented heat sealable film's surface. Such tie-resin materials may be blended in with the specific monoaxially oriented film's surface layer, coextruded as a discrete tie-resin-including tie-layer with the monoaxially oriented film, or applied as a primer solution coating upon one side of the monoaxially oriented film's chosen surface prior to application of the barrier layer. Suitable and preferable tie materials are: maleic anhydride-grafted propylene homopolymers or copolymers, ethylene polar terpolymers such as ethylene-acrylic acid-maleic anhydride terpolymers, or blends thereof; or primers such as polyethyleneimine.

All these examples can also be metallized via vapor-deposition, preferably a vapor-deposited aluminum layer, with an optical density of at least about 1.5, preferably with an optical density of about 2.0 to 4.0, and even more preferably between 2.3 and 3.2. In the embodiments in which the invention is part of a multi-layer coextruded film, the metal receiving layer or surface may be specially formulated or discharge-treated to enhance metal deposition, metal nucleation, and metal adhesion properties.

This invention provides a method to improve the heat sealability of monoaxially oriented films resulting in an economical, highly sealable film with excellent directional tear and gas barrier properties suitable for packaging applications. The invention helps solve the problems associated with the prior art of directional tear polyolefin substrates in packaging applications.

Additional advantages of this invention will become readily apparent to those skilled in the art from the following detailed description, wherein only the preferred embodiments of this invention is shown and described, simply by way of illustration of the best mode contemplated for carrying out this invention. As will be realized, this invention is capable of other and different embodiments, and its details are capable of modifications in various obvious respects, all without departing from this invention. Accordingly, the examples and description are to be regarded as illustrative in nature and not as restrictive.

DETAILED DESCRIPTION OF THE INVENTION

Described are mono-oriented films that possess linear tear properties. The films include a blend of an incompatible polymer such as low density polyethylene (LDPE) with propylene-based random copolymers and/or terpolymers. The films, when mono-oriented, display the tendency to fibrillate. These properties, for example, facilitate a linear tear in a pouch made utilizing the films layer. Neither LDPE nor the higher modified polypropylene polymers will display the linear tear properties alone, even when mono-oriented. In addition, the films also include a gas barrier layer and a vapor-deposited metal layer on the gas barrier layer to achieve a high gas barrier, straight-line tearable, and high seal strength, low seal temperature initiation packaging film.

When mono-oriented, homopolymer and impact propylene-based resins will display linear or directional tear properties without further modification. Described are formulations that provide a linear tear film with lower melting temperature polymers. This allows for a heat seal layer film with significantly lower seal initiation temperature that still retains linear tear properties.

In some embodiments, the films are well-suited as the sealable film component for certain pouch packaging applications, in particular, non-retortable pouches. In addition, the films are highly suitable for packages that require hand-tearability and can produce a tear line that is controlled and consistent across the top of the pouch and parallel to the top of the pouch, without causing "zippering" of the pouch and subsequent potential loss of the contents. This invention is novel in that it combines both excellent seal strengths and hermetic seals suitable for pouching and directional tear, obviating the need for perforation techniques to enable directional tear.

In one embodiment, the laminate film includes a single-layer mono-oriented extruded film of: A mixed polyolefin resin layer including a propylene random copolymer and an amount of a low density ethylene homopolymer. Another embodiment of the inventive film includes a similar formulation as above, except that one side of the mixed polyolefin resin layer is discharge-treated.

The mixed polyolefin resin layer is uniaxially oriented. The propylene random copolymer can be an isotactic ethylene-propylene impact copolymer with an ethylene-propylene rubber content of about 10-30 wt % of the polymer wherein the ethylene content of the rubber is about 10-80 wt % of the rubber. Typically, the copolymer is an ethylene-propylene copolymer, an ethylene-butene copolymer, a propylene-butene copolymer, or an ethylene-propylene-butene copolymer. Preferably, an ethylene-propylene or ethylene-propylene-butene copolymer is used. The copolymer may be an elastomer or plastomer. A thermoplastic elastomer can be described as any of a family of polymers or polymer blends (e.g. plastic and rubber mixtures) that resemble elastomers in that they are highly resilient and can be repeatably stretched and, upon removal of stress, return to close to its original shape; is melt-processable at an elevated temperature (uncrosslinked); and does not exhibit significant creep properties. Thermoplastic elastomers typically have a density of between 0.860 and 0.890 g/cm$^3$ and a molecular weight $M_w$ of 100,000 or greater. Plastomers differ from elastomers: a plastomer can be defined as any of a family of ethylene-based copolymers (i.e. ethylene alpha-olefin copolymer) which has properties generally intermediate to those of thermoplastic materials and elastomeric materials (thus, the term "plastomer") with a density of less than about 0.900 g/cm$^3$ (down to about 0.865 g/cm$^3$) at a molecular weight $M_w$ between about 5000 and 50,000, typically about 20,000 to 30,000. Plastomers generally have an ethylene crystallinity between thermoplastics and ethylene alpha-olefin elastomers and are generally of a higher crystallinity than elastomers (which can generally be considered amorphous). As such, plastomers generally have better tensile properties than elastomers.

A suitable example of ethylene-propylene impact copolymer for is Total Petrochemical's 5571. This resin has a melt flow rate of about 7 g/10 minutes at 230° C., a melting point of about 160-165° C., a Vicat softening point of about 148° C., and a density of about 0.905 g/cm$^3$. Another example of ethylene-propylene impact copolymer can be Total Petrochemical's 4180 with a melt flow rate of about 0.7 g/10 minutes at 230° C., a melting point of about 160-165° C., a Vicat softening point of about 150° C., and a density of about 0.905 g/cm$^3$. Other suitable ethylene-propylene impact copolymers can be Sunoco Chemical's TI-4015-F with a melt flow rate of 1.6 g/10 minutes at 230° C. and a density of about 0.901 g/cm$^3$ and ExxonMobil Chemical's PP7033E2 with a melt flow rate of about 8 g/10 minutes at 230° C. and a density of about 0.9 g/cm$^3$.

Suitable examples of propylene random copolymers are: Total Petrochemicals Z9421 ethylene-propylene random copolymer elastomer of about 5.0 g/10 min melt flow rate (MFR) at 230° C., melting point of about 120° C., density 0.89 g/cm$^3$, and ethylene content of about 7 wt % of the polymer; Total Petrochemicals 8473 ethylene-propylene random copolymer of about 4.0 MFR at 230° C. and ethylene content of about 4.5 wt % of the polymer; Sumitomo Chemical SPX78R1 ethylene-propylene-butene random copolymer of about 9.5 g/10 min MFR at 230° C., ethylene content of about 1.5 wt %, and butene content of about 16 wt % of the polymer; or ExxonMobil Chemical Vistamaxx™ ethylene-propylene random copolymer elastomers such as grade 3980 FL with an MFR of about 8.3 g/10 min at 230° C., Vicat softening point of about 80° C., melting point of about 79° C., density of about 0.879 g/cm$^3$, and ethylene content of about 8.5 wt %. Other suitable propylene-based copolymers and elastomers may be contemplated including but not limited to: metallocene-catalyzed thermoplastic elastomers like ExxonMobil's Vistamaxx™ 3000 grade, which is an ethylene-propylene elastomer of about 11 wt % ethylene content, 8 g/10 min MFR at 230° C., density of 0.871 g/cm$^3$, $T_g$ of −20 to −30° C., and Vicat softening point of 64° C.; or ethylene-propylene alpha-olefin copolymer plastomers of Dow Chemical's Versify™ grades, such as grade 3300, which is an ethylene-propylene plastomer of about 12 wt % ethylene content, 8 g/10 min MFR at 230° C., density of 0.866 g/cm$^3$, $T_g$ of −28° C., and Vicat softening point of 29° C.

A suitable example of LDPE is ExxonMobil LD105.30 low density ethylene homopolymer resin of about 2.0 g/10 min melt flow index at 190° C., melting point about 111° C., and density of about 0.923 g/cm$^3$. Other grades of LDPE of similar properties can be used as well and the invention is not limited to only the grades described.

The LDPE is blended with the propylene-based random copolymer at about 3 to 65 wt % of the layer, preferably about 5-50 wt %, and more preferably about 10-40 wt %. A higher content of LDPE (e.g. 40-65 wt %) helps improve the inventive film's bonding to polyethylene-based zipper stocks commonly used in pouching applications; however, optical clarity may be worsened by the higher loadings. Optionally, whitening pigments can be added to the inventive film to produce a white sealant film, useful for certain aesthetic appearance to the pouch or package application. Whitening agents can include—but are not limited to—$TiO_2$, barium sulfates, optical brighteners, or calcium carbonates.

It can also be contemplated to add an optional amount of antiblocking agent to the mixed resin film layer for aiding machinability and winding. An amount of an inorganic antiblock agent can be added in the amount of 100-5,000 ppm of the heat sealable resin layer (A), preferably 500-1000 ppm. Preferred types of antiblock are spherical sodium aluminum calcium silicates or an amorphous silica of nominal 6 μm average particle diameter, but other suitable spherical inorganic antiblocks can be used including crosslinked silicone polymer or polymethylmethacrylate, and ranging in size from 2 μM to 6 μm. Migratory slip agents such as fatty amides and/or silicone oils can also be optionally employed in the film layer either with or without the inorganic antiblocking additives to aid further with controlling coefficient of friction and web handling issues. Suitable types of fatty amides are those such as stearamide or erucamide and similar types, in amounts of 100-5000 ppm of the layer. Preferably, erucamide is used at 500-1000 ppm of the layer. A suitable silicone oil that can be used is a low molecular weight oil of 350 centistokes which blooms to the surface readily at a loading of 400-600 ppm of the layer. However, if the films are desired to be used for metallizing or high definition process printing, it is recommended that the use of migratory slip additives be avoided in order to maintain metallized barrier properties and adhesion or to maintain high printing quality in terms of ink adhesion and reduced ink dot gain.

This mixed resin layer (A) of propylene-based random copolymer and LDPE is typically 50 μm to 200 μm in thickness after monoaxial orientation, preferably between 60 μm and 150 μm, and more preferably between 70 μm and 100 μm in thickness. The mixed resin layer can also be surface treated on one side with either an electrical corona-discharge treatment method, flame treatment, atmospheric plasma, or corona discharge in a controlled atmosphere of nitrogen, carbon dioxide, or a mixture thereof, with oxygen excluded and its presence minimized. The latter method of corona treatment in a controlled atmosphere of a mixture of nitrogen and carbon dioxide results in a treated surface that includes nitrogen-bearing functional groups, preferably at least 0.3 atomic % or more, and more preferably, at least 0.5 atomic % or more. The discharge-treated mixed resin layer is then well suited for subsequent purposes of laminating, coating, printing, or metallizing.

In the embodiments in which a multi-layer film such as a two-layer laminate film or a three-layer laminate film is contemplated, the mixed resin layer (A) of the previously described propylene random copolymer and LDPE can be coextruded with another layer. In the embodiment of a 2-layer laminate film structure, the mixed resin layer (A) includes a sealant layer on one side of a core layer (B). Preferably, this core layer (B) includes a polyolefin resin-containing layer which in turn, includes a propylene homopolymer or propylene copolymer. More preferable is an ethylene-propylene impact copolymer or an ethylene-propylene random copolymer of similar types used as a component of the (A)-layer such as the previously described Total 5571 isotactic ethylene-propylene impact copolymer or other copolymer grades mentioned. The (A)-layer can be the same thickness as the (B) core layer, but preferably is thinner than the (B)-layer, about 5-50% of the total thickness of the (A) and (B) layers combined, more preferably 10-30% of the total thickness of the laminate film structure (A) and (B) layers combined. This core polyolefin resin-containing layer can also include an antiblock component selected from the group consisting of amorphous silicas, aluminosilicates, sodium calcium aluminum silicates, crosslinked silicone polymers, and polymethylmethacrylates to aid in machinability and winding. Migratory slip additives such as fatty amides or silicone oils could also be added as previously described if desired. It can also be contemplated to discharge-treat the side of the core layer (B) opposite the heat sealable layer (A) in order to enhance that side for laminating via adhesives, etc. Discharge-treating can be done by any of several means well known in the art, such as corona, flame, plasma, or discharge-treatment in a controlled atmosphere of selected gases as described previously.

In the embodiment of a 3-layer laminate film structure, a third layer (C) would be disposed on the side of the core layer (B) opposite the heat sealable mixed resin layer (A) and preferably includes a polyolefin resin-containing layer which in turn, includes a polyolefin selected from the group consisting of propylene homopolymer, copolymers, terpolymers, polyethylene, or maleic anhydride-grafted polypropylene, polyethylene, or copolymers thereof, and combinations of all thereof. This third layer (C) will generally be thinner than the core layer (B) and can be a thickness ranging 2-30% of the combined thickness of the 3 layers together, preferably about 5-10% of the overall thickness of the multi-layer laminate. This third polyolefin resin-containing layer can also include an antiblock component selected from the group consisting of amorphous silicas, aluminosilicates, sodium calcium aluminum silicates, crosslinked silicone polymers, and polymethylmethacrylates to aid in machinability and winding and/or migratory slip additives such as fatty amides or silicone oils. The third polyolefin layer can also be a discharge-treated layer having a surface for lamination, metallizing, printing, or coating with adhesives or other materials.

In the above embodiments of multi-layer films, the respective layers can be coextruded through a multi-layer compositing die such as a 2- or 3-layer die, and cast onto a chill roll to form a solid film suitable for further processing. In the case of a single layer film, the respective layer can be extruded through a single-layer die and cast onto a chill roll to form a solid film suitable for further processing. Extrusion temperatures are typically set at 235-270° C. with a resulting melt temperature at the die of about 230-250° C.

In all these embodiments, a key element is to monoaxially orient the film layer in the machine direction to a certain amount. It is this monoaxial orientation that imparts the directional or linear tearing properties that make it useful in pouching applications. It is the combination of this monoaxial orientation with the heat sealable resin formulation of propylene-based random copolymer and low density polyethylene that allows excellent and suitable heat seal initiation and seal strengths fit-for-use in pouch applications and excellent directional and linear tear properties. The amount of monoaxial machine direction orientation should be about 2.5-7 times in the machine direction, preferably 3-7 times, and more preferably 4.0 to 6.0 times. Suitably clean and linear tear properties are found at these monoaxial orientation rates. However, above a 7:1 machine direction orientation ratio, processability issues may result such as film breakage which can affect the product cost and machine efficiency; below a 2.5:1 machine direction orientation ratio, processability issues such as uneven film profile, gauge bands, and uneven stretch marks can occur which also can result in higher product costs and lower machine efficiencies.

Surprisingly, it is the combination of the propylene random copolymer, LDPE, and MD orientation as described above, that provides both excellent SIT and directional tear properties. MD orientation of each of the resin components alone—i.e. the unblended propylene random copolymer or the unblended LDPE—does not provide satisfactory directional tear. Without being bound by any theory, it is hypothesized that the incompatibility of the LDPE in the propylene-based random copolymer during mono-orientation aids in forming "fibrils" which improves the directional or linear tear properties. It is believed that the domains or regions of incompatible LDPE within the propylene-based copolymer matrix become oriented or ordered during mono-orientation in such a way that these "oriented domains" form zones or "fault lines" that facilitate linear tear parallel to the direction of orientation. It is noted that mono-orientation of propylene-based random copolymers or LDPE by itself did not exhibit satisfactory linear tear (although in contrast, mono-orientation of high density polyethylene (HDPE) does exhibit good linear tear properties; it is possible that the orientation of the crystalline and amorphous regions in the HDPE provide good linear tear properties).

Indeed, it is possible that any incompatible polymer to the propylene-based random copolymer could help improve linear tear properties of amorphous or low crystallinity mono-oriented polymer films. It can also be speculated that the principle could be applied to cast or blown LDPE films whereby an incompatible polymer (e.g. propylene random copolymer or homopolymer) is added as a minority component to the LDPE film, oriented in machine direction, and thus exhibit satisfactory linear tear properties as well as low seal initiation properties similar to conventional blown or cast LDPE films used as heat sealing films.

Moreover, the limited compatibility of the LDPE with the ethylene portions of the propylene random copolymer also helps maintain desirable optical clarity properties (reduced haze if transparent film is desired) and significantly lower seal initiation temperatures. With higher loadings of LDPE, the directional tear properties are seen to be generally further improved (with a fixed mono-orientation rate) as well as heat seal initiation temperature; while heat seal properties for strength and hot tack are maintained by the propylene-based random copolymers.

The inventive resin blend—whether in single layer or multi-layer embodiments—is extruded into a sheet form and cast onto a cooling drum at a speed of 6 to 15 mpm whose surface temperature is controlled between 20° C. and 60° C. to solidify the non-oriented laminate sheet. The non-oriented laminate sheet is stretched in the longitudinal direction at about 90° C. to 110° C. at a stretching ratio of about 2.5 to about 7 times the original length, and most preferably between about 4.0 and 6 times, and the resulting stretched sheet is annealed or heat-set at about 130° C. to 150° C. in the final zones of the machine direction orientation section to reduce internal stresses and minimize thermal shrinkage and to obtain a dimensionally stable uni-axially oriented laminate sheet. After orientation, the typical film thickness is 50-200 μm and most preferably, 70-100 μm. The uni-axially oriented sheet can then pass through a discharge-treatment process on one side of the film such as an electrical corona discharge treater to impart a suitable surface for lamination to other films as desired. The one-side treated film is then wound into roll form.

A further embodiment is to metallize the discharge-treated surface of the resin blend layer. The unmetallized laminate sheet is first wound in a roll. The roll is placed in a metallizing chamber and the metal vapor-deposited on the discharge-treated mixed resin metal receiving layer surface. The metal film may include titanium, vanadium, chromium, manganese, iron, cobalt, nickel, copper, zinc, aluminum, gold, or palladium, the preferred being aluminum. Metal oxides—as well as silicon oxides—can also be contemplated, the preferred being aluminum oxide. The metal layer can have a thickness between 5 and 100 nm, preferably between 20 and 80 nm, more preferably between 30 and 60 nm; and an optical density between 1.5 and 5.0, preferably between 2.0 and 4.0, more preferably between 2.3 and 3.2. The metallized film is then tested for oxygen and moisture gas permeability, optical density, metal adhesion, metal appearance and gloss, and can be made into an adhesive laminate structure.

An additional embodiment can be contemplated in which the inventive film formulation can be co-extruded or coated with a polymeric or organic gas barrier material upon one side of the film. Preferably, a barrier coating can be applied to the discharge-treated surface or side of the inventive film. Such barrier coatings can include, but are not limited to, polyvinyl alcohol, ethylene vinyl alcohol, polyhydroxyaminoether, polyvinylidene chloride, vinyl alcohol-vinyl amine, or blends thereof, and either crosslinked or uncrosslinked. Such coatings may also require the use of a primer layer or tie-layer either coated onto the inventive film prior to the application of the barrier layer in order to provide strong bonds between the inventive film layer and the barrier layers; or co-extruded as a skin layer with the inventive film layer or blended into the inventive film layer as an optional component. A suitable tie-layer or tie-resin for blending can include a maleic anhydride-grafted polyolefin. The barrier coatings may be applied in either off-line or in-line coating processes well known in the art. It can also be contemplated to coextrude the barrier layer using (but not limited to) extrusion-grade ethylene vinyl alcohol resin, polyvinyl alcohol resin, or polyhydroxyaminoether resin. Again, a tie-layer may be advantageously coextruded as an intermediate layer between the barrier layer and the inventive film layer to improve bonding of these polar and non-polar polymers. A preferred embodiment would be to further metallize as described previously upon the surface of the barrier layer which is opposite the side with the inventive film layer.

For such barrier coatings or layers, an EVOH can be used as a layer applied contiguously on one surface of layer (A) or the exposed surface of core layer (B) or (C) as described in the previous embodiments by several means such as coextrusion or as an extrusion-coating. In the case of a coextrusion, followed by subsequent mono-axial orientation, it is generally necessary to use an extrusion-grade EVOH with a higher ethylene content of 27 to 48 mol %. Preferably, extrusion-grade EVOH of 38-48 mol % are used, especially at higher orientation rates to ensure the EVOH can withstand the orientation stresses without cracking or fracturing. Such cracking of the EVOH layer could result in poor gas barrier properties. It can also be contemplated to extrusion-coat an extrusion-grade EVOH onto the directional tear heat sealable basefilm by using an extruder and die positioned after the machine direction orienter (MDO) and prior to winding. It can also be contemplated to extrusion-coat an extrusion-grade EVOH directly onto an already-made mono-axially oriented directional tear film as described previously.

Due to the preferred high ethylene content of the extrusion-grade EVOH, it may be possible to coextrude or extrusion-coat such EVOH directly with the propylene copolymer/LDPE blend of the inventive film without use of a specialized tie-resin or tie-layer and maintain good compatibility and adhesiveness between the base layer and the EVOH. However, it may be desirable to use a tie-resin to enhance further the adhesiveness of the EVOH to the base layer. Such tie-materials may be blended in with the base layer or extruded or coated onto the substrate prior to application of the EVOH. In the case of coextrusion, it is preferable to coextrude either a discrete tie-resin layer or blend a tie-resin into the base layer.

A suitable tie-resin for blending or coextrusion can be a maleic anhydride-grafted propylene homopolymer or copolymer (preferably copolymer with ethylene) such as Mitsui Admer™ QF551A maleic anhydride-grafted ethylene propylene copolymer. Mitsui Admer™ QF500A maleic anhydride-grafted propylene homopolymer can also be used. The amount of anhydride in these grafted polymers is about 0.12% to 0.15%. The maleic anhydride-grafted propylene-containing polymers can contain some ethylene-propylene rubber or it may not. The amount of maleic anhydride-grafted propylene-containing polymer used for blending into the base layer of the directional tearable film formulation is about 5 to 50 wt %, and more preferably about 15-30 wt %. As a discrete tie-layer coextruded with the base layer, about 100 wt % of the tie-resin may be used.

Alternatively, the tie-resin can include an ethylene polar terpolymer such as ethylene-butyl acrylate-maleic anhydride copolymer and/or ethylene-glycidal methacrylate-methyl acrylate copolymer. For cost savings and/or ease of use, the ethylene polar terpolymer can be blended with an ethylene propylene copolymer, using only enough ethylene polar terpolymer to provide adequate bonding. The ethylene-propylene copolymer (EP copolymer) can be of any number of commercially available EP copolymers, ranging from 1% ethylene to about 70% ethylene. Suitable EP copolymers suitable for this tie-layer blend are, for example, Total 8473 (a nominal 4 wt % ethylene content EP copolymer) and Lanxess Buna EP-T-2070-P (a nominal 65-71 wt % ethylene content EP copolymer). Preferably, the EP copolymer component of this tie-layer blend is in the 3-6% ethylene content range. Suitable ethylene polar terpolymers for this tie-layer blend are such as those available from Arkema: Lotader 4210 (an ethylene-butyl acrylate-maleic anhydride terpolymer) or Lotader AX8900 (an ethylene-glycidal methacrylate-methyl acrylate terpolymer). Lotader 4210 is a copolymer of about 91% ethylene, 6% butyl acrylate, and 4% maleic anhydride; it should be noted that Lotader 4210 is not a grafted maleic anhydride polymer like Admer QF551A or QF500A. Lotader AX8900 is a copolymer of about 67% ethylene, 8% glycidal methacrylate, and 25% methyl acrylate. The blending ratio of this alternate tie-layer formulation is about 10 to 50 wt % of the base layer, more preferred is 10-20 wt %.

The extrusion grade EVOH can be of any suitable grade. In particular, those grades available from Nippon Gohsei and Kuraray are preferred such as: Nippon Gohsei Soarnol® SG645B EVOH grade, 38 mol % ethylene content, melt index 3.5 g/10 minutes at 210° C., density 1.16 g/cm$^3$, melting point 130-200° C.; Kuraray Evalca® EVOH grade G176, 48 mol % ethylene content, melt index 15.0 g/10 minutes at 210° C., density 1.12 g/cm$^3$, melting point 160° C.; Kuraray Evalca® EVOH grade E105, 44 mol % ethylene content, melt index 13.0 g/10 minutes at 210° C., density 1.14 g/cm$^3$, melting point 165° C.; Kuraray Evalca® EVOH grade H171, 38 mol % ethylene content, melt index 3.4 g/10 minutes at 210° C., density 1.17 g/cm$^3$, melting point 172° C.; Kuraray Evalca® EVOH grade C109, 35 mol % ethylene content, melt index 21.0 g/10 minutes at 210° C., density 1.17 g/cm$^3$, melting point 177° C.; Kuraray Evalca® EVOH grade F171, 32 mol % ethylene content, melt index 3.7 g/10 minutes at 210° C., density 1.19 g/cm$^3$, melting point 183° C.; Kuraray Evalca® EVOH grade J102, 32 mol % ethylene content, melt index 3.9 g/10 minutes at 210° C., density 1.17 g/cm$^3$, melting point 183° C.; and Kuraray Evalca® EVOH grade L104, 27 mol % ethylene content, melt index 8.9 g/10 minutes at 210° C., density 1.20 g/cm$^3$, melting point 191° C.

If one uses those extrusion grade EVOH's which include 38 mol % ethylene content or higher (e.g. 44 mol %, 48 mol %), these will have a better ability to orient. Lower ethylene content EVOH can also be used (e.g. 35 mol %, 32 mol %, 27 mol %) but generally may be limited to lower orientation rates to prevent or minimize cracking of the EVOH layer. In terms of better barrier properties and degradability, it may be preferred to use those EVOH grades that have a lower ethylene content of 27-38 mol %. In addition, the higher ethylene content EVOH's may have better compatibility with the propylene copolymer/LDPE blend of the heat sealable directional tearable film when coextruding or extrusion-coating the EVOH.

EVOH, PVOH, or EVOH/PVOH aqueous coating blends may also be used and can either be coated onto the surface of the base layer either in-line (i.e. via a coating station placed after the machine direction orienter and before the take-up winder) or off-line (i.e. coating applied after the base layer is made on a separate coating line). The method to apply the coating can be of any means well-known in the art such as rod coating, slot die coating, knife-over-roll coating, spray coating, or gravure roll coating. Preferably, gravure roll coating method is used. As mentioned previously, it is desirable to improve adhesion of the polar barrier coating layer to the substrate layer by means of modifying the substrate layer with a tie-resin or coextruded tie-layer formulation, or by means of applying a primer coating. In the latter case, the primer coating may be applied and dried in-line prior to application of the barrier coating layer or off-line prior to application of the barrier coating. A suitable primer can be aqueous polyethyleneimine (PEI) at a coating weight of about 0.010 to 0.050 g/m$^2$, preferably 0.015 to 0.030 g/m$^2$. A popular PEI primer is available from Mica Corporation such as grades H760A (12% non-volatile solids content, pH 9 at 25° C., 50 cp at 25° C.) or A131X (5% non-volatile solids, pH 10.5 at 25° C.). These PEI primers typically crosslink after drying.

A preferable barrier coating can be a blend of EVOH and PVOH which is also crosslinked. The coating layer is a 5-20 wt % non-volatile solids (NVS) aqueous coating (prior to drying), including a blend of EVOH and PVOH. The EVOH component is about 3-10 wt % NVS of the total solution, preferably 3.5-8.5 wt % NVS. The EVOH is a water soluble grade, preferably 5-20 mol % ethylene with 92.0-99.5 mol-% degree of hydrolysis, and more preferably 5-10 mol % ethylene with 97.5-99.0 mol-% degree of hydrolysis (saponification). The PVOH component is also water soluble, preferably a partially or fully hydrolyzed grade of about 88.0-98.4 mol-% degree of hydrolysis respectively, and about 4.00+/−0.50 cP solution viscosity at 4 wt % solids. The PVOH component used in the total solution is about 0.2-12.0 wt % NVS. The NVS amount of EVOH to PVOH ranges from 25-90 wt % EVOH (75-10 wt % PVOH). Also included in this coating formulation is an amount of glyoxal (aka ethanedial) crosslinking agent from 0.25-2.5 wt % NVS of the coating, preferably 0.3-1.75 wt % NVS. An optional amount of defoamer may also be added from 0.05-0.15 wt % of the total coating, preferably 0.06-0.10 wt %. (The amount of defoamer used must be watched, as too much can cause de-wetting of the coating from the substrate; too little could be ineffective as a defoamer.) The coating formulation is preferably 5-20 wt % solids in aqueous solution, more preferably 10-18 wt % solids and even more preferably 12-15 wt % solids. After drying, the dried coating thickness is preferably 0.1-1.0 g/m$^2$, preferably 0.20-0.75 g/m$^2$, and more preferably, 0.3-0.5 g/m$^2$.

The total % NVS of the aqueous solution is from 5-20 wt %, preferably 10-18 wt %, and more preferably 12-15 wt % with a viscosity of less than 200 cps, preferably 100-200 cps. The higher the percent non-volatile solids, the more cost-effective the coating is as less water needs to be driven off. However, the higher the % solids become, the more viscous the coating becomes, and the more difficult it may become to process due to foaming, slinging, etc. The coating may optionally be heated to 120° F. (49° C.) to further aid lowering the coating viscosity and reducing foaming tendency.

As mentioned, the EVOH component of the in-line coating is a water soluble grade, preferably of 5-20 mol % ethylene content and of 92.0-99.5 mol-% degree of hydrolysis. Suitable EVOH types can be those produced and distributed by Kuraray America Inc. under the tradename Exceval® which are medium hydrolyzed grade RS1717 (viscosity 23.0-30.0 mPa-sec of a 4 wt % solids aqueous solution at 20° C. determined by Brookfield synchronized rotary-type viscometer; 92.0-94.0 mol-% degree of hydrolysis; 0.4 wt % maximum ash content calculated as Na$_2$O; and 5.0 wt % maximum volatile content after 3 hours drying at 105° C. with methanol content less than 3.0 wt %); fully hydrolyzed grade RS117 (viscosity 23.0-30.0 mPa-sec of a 4 wt % solids aqueous solution at 20° C. determined by Brookfield synchronized rotary-type viscometer; 97.5.0-99.0 mol-% degree of hydrolysis; 0.4 wt % maximum ash content calculated as Na$_2$O; and 5.0 wt % maximum volatile content after 3 hours drying at 105° C. with methanol content less than 3.0 wt %); and super hydrolyzed grade HR-3010 (viscosity 12.0-16.0 mPa-sec of a 4 wt % solids aqueous solution at 20° C. determined by Brookfield synchronized rotary-type viscometer; 99.0-99.4 mol-% degree of hydrolysis; 0.4 wt % maximum ash content calculated as Na$_2$O; and 5.0 wt maximum volatile content after 3 hours drying at 105° C. with methanol content less than 3.0 wt %). Of these commercially available grades, the RS117 grade is particularly preferred which has a molecular weight of Mw of about 130,000 g/mol, Mn of about 53,000 g/mol, Mw/Mn of about 2.4-2.5 via GPC measurement.

Suitable grades of water soluble PVOH can be obtained from Celanese Chemicals Inc. such as Celvol® fully hydrolyzed PVOH grades 103 (98.40+/−0.40 mol-% hydrolysis, 4 wt % solids solution viscosity 4.00+/−0.50 cP, total volatiles 5.00 wt % maximum, methanol maximum 0.90 wt %, ash maximum 1.20 wt %, and 4 wt % solution pH 6.00+/−1.00); grade 125 (99.65+/−0.35 mol-% hydrolysis, 4 wt % solids solution viscosity 30.00+/−2.00 cP, total volatiles 5.00 wt % maximum, methanol maximum 0.90 wt %, ash maximum 1.20 wt %, and 4 wt % solution pH 6.50+/−1.00); grade 305 (98.40+/−0.40 mol-% hydrolysis, 4 wt % solids solution viscosity 5.00+/−0.50 cP, total volatiles 5.00 wt % maximum, methanol maximum 0.90 wt %, ash maximum 1.20 wt %, and 4 wt % solution pH 6.00+/−1.00); and grade 825 (98.40+/−0.40 mol-% hydrolysis, 4 wt % solids solution viscosity 30.00+/−2.00 cP, total volatiles 5.00 wt % maximum, methanol maximum 0.90 wt %, ash maximum 1.20 wt %, and 4 wt % solution pH 6.00+/−1.00).

Also very suitable are Celanese Celvol® partially hydrolyzed grades 203 (88.00+/−1.00 mol-% hydrolysis, 4 wt % solids solution viscosity 4.00+/−0.50 cP, total volatiles 5.00 wt % maximum, methanol maximum 0.90 wt %, ash maximum 0.90 wt %, and 4 wt % solution pH 5.50+/−1.00); grade 523 (88.00+/−1.00 mol-% hydrolysis, 4 wt % solids solution viscosity 25.00+/−2.00 cP, total volatiles 5.00 wt % maximum, methanol maximum 0.90 wt %, ash maximum 0.50 wt %, and 4 wt % solution pH 5.50+/−1.00); and grade 502 (88.00+/−1.00 mol-% hydrolysis, 4 wt % solids solution viscosity 3.35+/−0.35 cP). Particularly preferred are the lower viscosity grades 103 fully hydrolyzed PVOH powder, and grades 502 granular powder and 203 partially hydrolyzed PVOH, of which the latter can be commercially available as a 23 wt % non-volatile solids aqueous solution.

Another important component of the coating formulation is the crosslinking agent for the PVOH component. Suitable crosslinker can be obtained from Emerald Performance Materials such as their grade Freechem® 40DL glyoxal (aka ethanedial) at ca. 40 wt % glyoxal non-volatile solids aqueous solution, less than 0.8 wt % residual acid, pH of 3.0, and specific gravity 1.270.

Optionally, an amount of defoamer can be added to help control foaming during the coating application. A suitable defoamer can be obtained from Air Products Inc as grade Surfynol® 420 nonionic surfactant ethylene oxide-based defoaming agent with ethylene oxide content 1.3 mol % (20 wt %), specific gravity 0.943 at 25° C., viscosity <250 cps at 20° C., hydrophile-lipophile balance of 4, pH at 1% aqueous solution of 6-8, and volatile organic content of 28 wt %.

In these embodiments, the surface of the dried and crosslinked EVOH/PVOH layer of these films may be discharge-treated. This polar layer can be surface-treated with either a corona-discharge method, flame treatment, atmospheric plasma, or corona discharge in a controlled atmosphere of nitrogen, carbon dioxide, or a mixture thereof (to the exclusion of $O_2$). The latter treatment method in a controlled atmosphere mixture of $CO_2$ and $N_2$ is preferred. This method of discharge treatment results in a treated surface that includes nitrogen-bearing functional groups, preferably 0.3% or more nitrogen in atomic %, and more preferably 0.5% or more nitrogen in atomic %. This treated layer can then be metallized, printed, coated, or extrusion or adhesive laminated.

A preferred embodiment is to metallize the surface of the crosslinked EVOH/PVOH polar polymer layer. The unmetallized coated laminate sheet is first wound in a roll. The roll is placed in a metallizing chamber and the metal vapor-deposited on the polar polymer resin layer surface. The metal film may include titanium, vanadium, chromium, manganese, iron, cobalt, nickel, copper, zinc, aluminum, gold, or palladium, the preferred being aluminum. Metal oxides can also be contemplated, the preferred being aluminum oxide. The metal layer shall have a thickness between 5 and 100 nm, preferably between 20 and 80 nm, more preferably between 30 and 60 nm; and an optical density between 1.5 and 5.0, preferably between 2.0 and 4.0, more preferably between 2.3 and 3.2. The metallized film is then tested for oxygen and moisture permeability, optical density, metal adhesion, and film durability.

This invention will be better understood with reference to the following examples, which are intended to illustrate specific embodiments within the overall scope of the invention.

Example 1

A single layer monoaxially oriented film was made using a monoaxial orientation process, including a blend of about 97 wt % Total Z9421 ethylene-propylene random copolymer and about 3 wt % ExxonMobil LD 105.30 low density polyethylene with about 1 part per hundred (phr) concentration of Ampacet 40878 Skiblock™ 5 wt % synthetic silica (nominal 2.0 μm size) antiblock masterbatch in propylene homopolymer carrier resin. The resin mixture was pellet-blended, then melt-extruded through a die, cast on a chill drum, and oriented in the machine direction at a 4.8:1.0 stretch ratio, through a series of heated and differentially sped rolls. The film was heat-set or annealed in the final zones of the MD orientation section to reduce internal stresses and minimize heat shrinkage of the film and maintain a dimensionally stable monoaxially oriented film. Final film thickness after orientation was ca. 70 μm (280 G). One surface of the film (the cast roll side) is treated via discharge treatment methods such as corona or flame or other methods, after orientation, in order to provide a higher surface energy, functionalized surface for further adhesive or extrusion lamination, coating, printing, or metallizing. The opposite side (air side or non-cast roll side) of the film is left untreated in order to preserve the heat sealable properties of the film. The mono-oriented film was wound in roll form and tested for haze, heat sealability, seal initiation temperature, and directional tear.

Example 2

Example 1 was substantially repeated except that the mixed resin layer was changed to a blend of about 90 wt % Z9421 random copolymer and about 10 wt % LD105.30 LDPE. About 1 part per hundred (phr) concentration of Ampacet 40878 synthetic silica antiblock masterbatch was added.

Example 3

Example 1 was substantially repeated except that the mixed resin layer was changed to about 40 wt % Z9421 random copolymer, about 40 wt % Vistamaxx™ 3980 elastomer, and about 20 wt % LD105.30 LDPE. About 4.6 parts per hundred (phr) concentration of Ampacet 40878 synthetic silica antiblock masterbatch was added.

Example 4

Example 1 was substantially repeated except that the mixed resin layer was changed to about 80 wt % Vistamaxx™ 3980 elastomer and about 20 wt % LD105.30 LDPE. About 4.6 parts per hundred (phr) concentration of Ampacet 40878 synthetic silica antiblock masterbatch was added.

Example 5

Example 1 was substantially repeated except that the mixed resin layer was changed to about 40 wt % Vistamaxx™

3980 elastomer, about 40 wt % Sumitomo SPX78R1 ethylene-propylene-butene copolymer, and about 20 wt % LD105.30 LDPE. About 2 parts per hundred (phr) concentration of Ampacet 40878 synthetic silica antiblock masterbatch was added.

Example 6

Example 1 was substantially repeated except that the mixed resin layer was changed to about 45 wt % Vistamaxx™ 3980 elastomer, about 30 wt % Sumitomo SPX78R1 ethylene-propylene-butene copolymer, and about 25 wt % LD105.30 LDPE. About 2 parts per hundred (phr) concentration of Ampacet 40878 synthetic silica antiblock masterbatch was added.

Example 7

Example 1 was substantially repeated except that the mixed resin layer was changed to about 35 wt % Vistamaxx™ 3980 elastomer and about 65 wt % LD105.30 LDPE. About 4 parts per hundred (phr) concentration of Ampacet 40878 synthetic silica antiblock masterbatch was added.

Example 8

Example 2 was substantially repeated except that the film thickness was nominal 240 G (60 μm) and the wound roll was taken to an off-line gravure roll coating line. The treated side's surface was first coated with a PEI primer of Mica H760A at a dried thickness of about 0.015 g/m² (about 0.0134 μm). A second coating was applied on top of the primed surface including an EVOH/PVOH aqueous solution of about 7 wt % non-volatile solids (NVS) with a solution viscosity of about 200 cps, which includes about 2.05 wt % solids (NVS) Exceval RS117 EVOH, 4.28 wt % NVS of Celvol 203 PVOH. About 2.0 wt % NVS Freechem 40DL glyoxal crosslinker was added. Surfynol 420 defoamer was also added at 0.10 wt % of the total solution. The total NVS of the coating solution was about 8.43 wt %. The coating was applied using a 10 bcm rotoflow Quad gravure cylinder in a reverse-gravure open-pan applicator. The coating formulation was preliminarily heated to about 24-27° C. prior to application. Coating speed was about 400-600 fpm (ca. 122-183 mpm), preferably about 550 fpm (168 mpm). The coated film was dried in an 3-zone air flotation oven at about 170-190° F. (ca. 76-88° C.), such that any thermal shrinkage of the film was kept to a minimum (e.g. less than 0.5% shrinkage, and preferably none). The thickness of the crosslinked EVOH/PVOH layer after drying was about 0.21 g/m² (0.19 μm). The resultant coated film was wound into roll form, removed, and then taken to a vacuum metallizing chamber and metallized via aluminum vapor deposition to an optical density of nominal 2.4. The resultant metallized, coated film was tested for appearance and gas barrier properties.

Example 9

Example 8 was substantially repeated except that the EVOH/PVOH coated layer was about 0.18 g/m² (0.16 μm) in thickness after drying. The coated film was metallized via aluminum vapor deposition at nominal 2.4 optical density. The resultant metallized, coated film was tested for appearance and gas barrier properties.

Comparative Example 1

Example 1 was substantially repeated except that the mixed resin layer was changed to 100 wt % Z9421 ethylene-propylene random copolymer. No Ampacet 40878 synthetic silica antiblock masterbatch was added.

Comparative Example 2

Example 1 was substantially repeated except that the mixed resin layer was changed to about 85 wt % Z9421 random copolymer and about 15 wt % high crystalline propylene homopolymer (Total Petrochemical 3270, melt flow rate 2.0 g/10 min at 230° C., 165° C. melting point, 0.91 g/cm³ density). About 1 part per hundred (phr) concentration of Ampacet 40878 synthetic silica antiblock masterbatch was added.

Comparative Example 3

Example 1 was substantially repeated except that the mixed resin layer was changed to about 70 wt % Z9421 random copolymer and about 30 wt % high crystalline propylene homopolymer (Total Petrochemical 3270, melt flow rate 2.0 g/10 min at 230° C., 165° C. melting point, 0.91 g/cm³ density). About 1 part per hundred (phr) concentration of Ampacet 40878 synthetic silica antiblock masterbatch was added.

Comparative Example 4

Example 1 was substantially repeated except that the mixed resin layer was changed to about 90 wt % Z9421 random copolymer and about 10 wt % cyclic olefin copolymer (Topas TO 9506F-04cyclic olefin copolymer (COC) resin, 5.5 g/10 min MFR at 230° C., density 1.02 g/cm³, and a glass transition temperature of 65° C.). About 1 part per hundred (phr) concentration of Ampacet 40878 synthetic silica antiblock masterbatch was added.

Comparative Example 5

Example 2 was substantially repeated except that no coatings were applied. Example 1 was taken to a vacuum metallizing chamber and metallized via vapor deposition of aluminum upon the treated side's surface at a nominal optical density of about 2.4. The resultant metallized film was tested for appearance and gas barrier properties.

The formulations and unlaminated properties of the Examples ("Ex.") and Comparative Examples ("CEx.") are shown in Tables 1, 2, and 3 respectively.

TABLE 1

| Composition (wt % except as noted) | CEx 1 | CEx 2 | CEx 3 | CEx 4 | Ex 1 | Ex 2 | Ex 3 | Ex 4 | Ex 5 | Ex 6 | Ex 7 |
|---|---|---|---|---|---|---|---|---|---|---|---|
| Total Z9421 | 100 | 85 | 70 | 90 | 97 | 90 | 40 | 0 | 0 | 0 | 0 |
| ExxonMobil 3980 FL | 0 | 0 | 0 | 0 | 0 | 0 | 40 | 80 | 40 | 45 | 35 |

TABLE 1-continued

| Composition (wt % except as noted) | CEx 1 | CEx 2 | CEx 3 | CEx 4 | Ex 1 | Ex 2 | Ex 3 | Ex 4 | Ex 5 | Ex 6 | Ex 7 |
|---|---|---|---|---|---|---|---|---|---|---|---|
| Sumitomo SPX78R1 | 0 | 0 | 0 | 0 | 0 | 0 | 0 | 0 | 40 | 30 | 0 |
| Total 3270 | 0 | 15 | 30 | 0 | 0 | 0 | 0 | 0 | 0 | 0 | 0 |
| ExxonMobil LD105.30 | 0 | 0 | 0 | 0 | 3 | 10 | 20 | 20 | 20 | 25 | 65 |
| Topas TO9506F-04 | 0 | 0 | 0 | 10 | 0 | 0 | 0 | 0 | 0 | 0 | 0 |
| Ampacet 40878 (phr) | 0 | 1 | 1 | 1 | 1 | 1 | 4.6 | 4.6 | 2 | 2 | 4 |

TABLE 2

| Sample | Tear Rating (1 = good; 4 = poor) | Haze % | Seal Initiation Temperature (SIT) °F. (°C.) | Heat Seal Strength @ 290° F. lbf/in | Heat Seal Strength @143.3° C. N/25 mm |
|---|---|---|---|---|---|
| CEx. 1 | 3 | 7.2 | 285 (140.6) | 2.46 | 10.94 |
| CEx. 2 | 3 | 15.9 | 330 (165.6) | N/A* | N/A* |
| CEx. 3 | 2 | 10.5 | 335 (168.3) | N/A* | N/A* |
| CEx. 4 | 4 | 10.1 | 285 (140.6) | 4.64 | 20.64 |
| Ex. 1 | 2 | 6.95 | 285 (140.6) | 8.02 | 35.67 |
| Ex. 2 | 1 | 6.6 | 280 (137.8) | 9.03 | 40.17 |
| Ex. 3 | 1 | 19.1 | 265 (129.4) | 2.09 | 9.30 |
| Ex. 4 | 4 | 59.7 | 230 (110.0) | 7.49 | 33.32 |
| Ex. 5 | 1 | 30.3 | 230 (110.0) | 5.68 | 25.27 |
| Ex. 6 | 1 | 39.4 | 250 (121.1) | 3.59 | 15.97 |
| Ex. 7 | 1 | 43.2 | 250 (121.1) | 4.80 | 21.35 |

*These examples did not record a value due to SIT being greater than 290° F. (143.3° C.)

TABLE 3

| Sample | Coating Thickness g/m² | Optical Density | MVTR g/m²/day | $O_2$TR cc/m²/day | $O_2$TR cc/m²/day 6% Elongated | $O_2$TR cc/m²/day 9% Elongated | Tear Rating (1 = good; 4 = poor) |
|---|---|---|---|---|---|---|---|
| CEx. 5 | NA | 2.38 | 0.141 | 20.5 | 25.1 | Fail | 1 |
| Ex. 8 | 0.21 | 2.51 | 0.083 | 2.7 | 3.3 | 12.3 | 1 |
| Ex. 9 | 0.18 | 2.32 | 0.279 | 4.4 | 4.7 | 15.2 | 1 |

As Table 1 showed, Comparative Example 1 (CEx 1) was a film including about 100 wt % Total Z9421 ethylene-propylene random copolymer. Table 2 shows test data for this composition having good haze of 7.2%. Any value less than 30 percent would be good for a clear packaging application, with up to 60 percent being acceptable for translucent applications. This film also showed an acceptable SIT and marginal heat seal strength of 2.46 lb/in (10.94 N/25 mm) at 290° F. (143.3° C.). However, when a film sheet was torn by hand at a notch along the machine direction, the appearance of the tear initiation point showed a qualitative 3 rating with stress-whitening and deformation and the torn edge was found to be irregular and often zippered down the face of the package in the transverse direction. A tear property rating of 1 or 2 is desirable, which indicates good directional tear properties and no or little zippering or non-uniform tear. CEx1's directional tear was considered to be poor or marginal at best.

Comparative Example 2 (CEx 2) showed a film formulation that used 85 wt % Total Z9421 random copolymer and 15 wt % Total 3270 high crystalline propylene homopolymer and which incorporated the Ampacet antiblock. In this example, the SIT was significantly higher than that of CEx 1 due to the addition of crystalline propylene homopolymer. Haze remained comparable at 15.9. However, the directional tear was still poor. Although the film could be rapidly torn with a fairly straight-edge and parallel to the machine direction of the sheet, if the tear was interrupted it could be torn at an angle. The addition of the crystalline homopolymer was to improve directional tear properties after orientation; compared to CEx. 1, directional tear was improved, though not enough.

Comparative Example 3 (CEx. 3) showed a film formulation that uses 70 wt % Total Z9421 random copolymer and 30 wt % Total 3270 high crystalline propylene homopolymer and which incorporated the Ampacet antiblock. In this example, the SIT was significantly higher than that of CEx. 1 and slightly higher than that of CEx. 2 due to the increased amount of crystalline propylene homopolymer. Haze remained very comparable. However, directional tear was improved and was considered acceptable, though SIT was undesirably higher at 335° F. (168.3° C.).

Comparative Example 4 (CEx 4) showed a film that used 90 wt % Total Z9421 random copolymer and 10 wt % cyclic olefin copolymer (COC) and which incorporated the Ampacet antiblock. No linear tear properties were observed with this formulation, though seal strength and SIT were acceptable.

Example 1 (Ex. 1) is a film that used about 97 wt % Total Z9421 ethylene-propylene random copolymer and about 3 wt % LDPE and which incorporated an amount of the Ampacet silica antiblock. This film showed an acceptable improvement in the tear properties from those of CEx. 1, 2 and 4 in addition to significantly improved heat seal strength and an acceptable SIT.

Example 2 (Ex. 2) showed a film that used 90 wt % Total Z9421 random copolymer and 10 wt % LDPE and which incorporated the Ampacet antiblock. It had excellent tear properties with no loss of heat seal strength or SIT properties. The additional LDPE also improved the bonds to LDPE based zipper stock, which is added to many packages to make them resealable. Directional tear was extremely good, with the tear propagating cleanly from the notch with no stress-whitening of deformations. The tear itself was very straight edged and parallel to the machine direction of the sheet.

Example 3 (Ex. 3) showed a film that used 40 wt % Total Z9421 random copolymer, 40 wt % Vistamaxx 1980 elastomer, and 20 wt % LDPE and which incorporated the Ampacet antiblock. This blend was designed to heat seal at a lower temperature than the prior examples. The LDPE percentage was increased for even better heat seal bonds to the LDPE zipper stock. This 20 wt % of LDPE formed acceptable 7 lb/in seals (31.14 N/25 mm) to the zipper stock. Tear properties were excellent. The haze was a bit higher and the seal strength was lower than that of prior examples.

Example 4 (Ex. 4) showed a film that used 80 wt % Vistamaxx 3980 elastomer, and 20 wt % LDPE and which incorporated the Ampacet antiblock. This film did not incorporate enough LPDE to render linear tear properties to the film. The Vistamaxx was rather rubbery and overwhelmed the 20 wt % LDPE part of the blend.

Example 5 (Ex. 5) showed a film that used 40 wt % Vistamaxx 3980 elastomer, 40 wt % Sumitomo SPX78R random copolymer, and 20 wt % LDPE and which incorporated the Ampacet antiblock. It was fairly similar to Example 3, having excellent tear properties and also a lower SIT than prior examples. The heat seal strength at 290° F. (143.3° C.) was higher than that of Example 3, but not as high as that of Examples 1, 2, and 4.

Example 6 (Ex. 6) showed a film that used 45 wt % Vistamaxx 3980 elastomer, 30 wt % Sumitomo SPX78R random copolymer, and 25 wt % LDPE and which incorporated Ampacet antiblock. This was a variation of Example 5 and showed high haze but other properties were similar, including excellent tear properties.

Example 7 (Ex. 7) showed a film that was 35 wt % Vistamaxx 3980 elastomer and 65 wt % LDPE with Ampacet antiblock master batch. The haze was fairly high. It showed excellent tear properties, good heat seal strength, and a low SIT due to the low melting point of the component and the increased thickness of the film. This example's results indicates that it is possible that the minority component of propylene-based elastomer provided the incompatible "fibrils" for linear tear properties in the LDPE majority component.

Comparative Example 5 (CEx. 5) is a film of the same formulation as Example 2 but which was metallized upon the treated surface at a nominal optical density of about 2.4. Oxygen and moisture barrier was measured on this film as shown in Table 3. In addition, a sample of CEx. 5 was then placed in an Instron tensile tester and elongated or stretched to 6% and 9% of its original length and oxygen barrier retested respectively. As Table 3 shows, after the elongation, the gas barrier worsened, and the 9% elongated sample failed to give a reading in the oxygen transmission tester, indicating that gas transmission was too high. This indicated that the metal layer had fractured, thus losing gas barrier properties. Elongated gas barrier properties can be an indicator of how well the gas transmission properties of a metallized film laminate can withstand the stresses and tensions of a packaging machine in forming bags. Such "barrier durability" is a desirable trait in metallized film laminates in which it is desired that the barrier properties before and after bag-forming are as similar as possible, or within a certain specification. After metallization, tear properties were also evaluated and were equivalent (very good) to the unmetallized film.

Example 8 (Ex. 8) is the film of Example 2 except that it was subsequently taken to a coating line and a primer and barrier coating applied to the treated surface. The coated film was then metallized to a nominal 2.4 optical density and gas barrier properties measured. As Table 3 shows, gas barrier, particularly oxygen, was significantly improved over CEx. 5. Elongated barrier for oxygen was also significantly improved, indicating that in a bag-forming operation, gas barrier properties are likely to be maintained at a reasonable level to provide product protection. Tear properties after coating and metallizing also remained unaffected (very good tear).

Example 9 (Ex. 9) is the film of Example 8 except that the gas barrier coating weight was lower. Oxygen barrier was significantly improved over CEx. 5, and comparable to Ex. 8. Moisture barrier, however, was worse than CEx. 5 and Ex. 8. Elongated oxygen barrier was still significantly better than CEx. 5 and comparable to Ex. 8. Tear properties remained excellent after coating and metallizing.

Thus, the foregoing Examples show a way to maintain high seal strengths, low seal initiation temperatures, high oxygen and moisture gas barrier, gas barrier durability, and yet provide the desirable attribute of directional tear that is imparted from orientation stretching of the film. Since it is expected that seal performance will be worsened after orientation of the film, our invention unexpectedly has shown excellent seal performance with orientation of the film.

Test Methods

The various properties in the above examples were measured by the following methods:

Heat seal strength: Measured by using a Sentinel sealer model 12 ASL at 25 psi, 1.0 second dwell time, with heated flat upper seal jaw Teflon coated, and unheated lower seal jaw, rubber with glass cloth covered. The film sample is heat-sealed to itself at the desired seal temperature(s) in the Sentinel sealer (e.g. 310° F.). To prevent the film from sticking to the sealer's jaws, the test film can be laid onto a heat-resistant film such as a biaxially oriented nylon or polyethylene terephthalate film (PET). These two films are then folded over such that the nylon or PET film is outermost and in contact with the heated sealer jaws; the test film is then the inner layer and will seal to itself upon application of heat and pressure. A 15-20 um thick nylon or PET film is recommended; if too thick, this may interfere with thermal transfer to the test film. The test film should be inserted between the heat sealer's jaws such that the film's machine direction is perpendicular to the heat sealer jaws. Heat seal temperatures may be increased at desired intervals, e.g. 10° F. increments. The respective seal strengths are measured using an Instron model 4201 tensile tester. The heat-sealed film samples are cut into 1-inch wide strips along the machine direction; the two unsealed tails placed in the upper and lower Instron clamps, and the sealed tail supported at a 90° angle to the two unsealed tails for a 90° T-peel test. The peak and average seal strength is recorded. The preferred value is about 3 lb/in (13.35 N/25 mm) at 290° F. (143.3° C.) seal temperature.

Seal initiation temperature: Heat seal initiation temperature (SIT) was measured by using a Sentinel sealer model 12 ASL at 25 psi, 1.0 second dwell time, with heated flat upper seal jaw Teflon coated, and unheated lower seal jaw, rubber with glass-cloth covered. The film sample is heat-sealed to itself at various desired seal temperatures in the Sentinel sealer and then the respective seal strengths are measured using an Instron model 4201 tensile tester as discussed above for heat seal strength determination. The Seal Initiation Temperature is defined as the seal temperature at which the film demonstrated a minimum of 1 lb/in (4.45 N/15 mm) heat seal strength. The preferred SIT value is 290° F. (143.3° C.) or lower.

Transparency of the film was measured by measuring haze of a single sheet of film substantially in accordance with ASTM D1003. Preferred haze value is 40% or less, though 60% haze or less can be acceptable for some applications.

Directional tear is tested qualitatively by notching a piece of test film on the edge and tearing by hand at the notch to initiate the tear. The notch is made parallel to the machine direction and the tear will be propagated along the machine direction. The tear is initiated from the notch by hand and observation made as to whether any stress-whitening or deformation occurs. As the tear is propagated, the consistency of the torn edges and the angle at which the tear propagates is observed. The preferred observation for good directional tear property is: 1) no stress-whitening or deformation; 2) torn edges are consistent and propagate cleanly; 3) the tear propagates in a straight line from the notch across the width of the sheet parallel to the machine direction; 4) tear would restart easily and propagate cleanly if interrupted. If the tear initiation at the notch shows stress-whitening or deformation; and/or the tear propagation is ragged, or is non-linear or non-parallel to the machine direction of the film, is propagated at an angle to the machine direction edge of the film; then this in considered to be unacceptable for directional or linear tear properties. Tear quality was rated qualitatively as follows:

1=Excellent linear tear property
2=Acceptable linear tear property
3=Marginal linear tear property
4=No linear tear property Wetting tension of the surfaces of interest was measured substantially in accordance with ASTM D2578-67. In general, the preferred value was an average value equal to or more than 40 dyne/cm with a minimum of 38 dyne/cm.

Oxygen transmission rate of the film was measured by using a Mocon Oxtran 2/20 unit substantially in accordance with ASTM D3985. A hand-lamination was made of the metallized PLA film using a 5.5-mil (137.5 μm) cast LDPE film with a pressure-sensitive adhesive (available from Berry Plastics, Inc. 502A clear LDPE tape with acrylic-based pressure sensitive adhesive) in order to protect the metallized film surface from handling damage. The pressure-sensitive adhesive side of the LDPE film would be adhered to the metallized side of the example film with a rubber roller to eliminate air pockets, bubbles, and wrinkles. In general, the preferred value for metallized films was an average value equal to or less than 15.5 cc/m$^2$/day at 23° C. and 0% relative humidity; and preferably less than 7.75 cc/m$^2$/day.

Moisture transmission rate of the film was measured by using a Mocon Permatran 3/31 unit measured substantially in accordance with ASTM F1249. A hand-lamination was made of the metallized PLA film using a 5.5-mil (137.5 μm) cast LDPE film with a pressure-sensitive adhesive (available from Berry Plastics, Inc. 502A clear LDPE tape with acrylic-based pressure sensitive adhesive) in order to protect the metallized film surface from handling damage. The pressure-sensitive adhesive side of the LDPE film would be adhered to the metallized side of the example film with a rubber roller to eliminate air pockets, bubbles, and wrinkles. In general, the preferred value for metallized films was an average value equal to or less than 0.31 g/m$^2$/day at 38° C. and 90% relative humidity.

Optical density was measured using a Tobias Associates model TBX transmission densitometer. Optical density is defined as the amount of light reflected from the test specimen under specific conditions. Optical density is reported in terms of a logarithmic conversion. For example, a density of 0.00 indicates that 100% of the light falling on the sample is being transmitted. A density of 1.00 indicates that 10% of the light is being transmitted; 2.00 is equivalent to 1%, etc.

Barrier durability of the film was measured by elongating test specimens in an Instron Tensile tester at 6 and 9% elongation. The elongated sample was then measured for barrier properties using Mocon Oxtran 2/20 or Permatran 3/31 units as described above. In general, preferred values of O$_2$TR (oxygen transmission rate), which is a measurement of the permeation rate of oxygen through a substrate, would be equal or less than 46.5 cc/m$^2$/day up to 9% elongation and MVTR (moisture vapor transmission rate), which is a measurement of the permeation rate of water vapor through a substrate, would be equal or less than 0.69 g/m$^2$/day up to 9% elongation.

This application discloses several numerical ranges in the text and figures. The numerical ranges disclosed inherently support any range or value within the disclosed numerical ranges even though a precise range limitation is not stated verbatim in the specification because this invention can be practiced throughout the disclosed numerical ranges.

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein. Finally, the entire disclosure of the patents and publications referred in this application are hereby incorporated herein by reference.

We claim:

1. A monoaxially oriented polyolefin film that exhibits excellent linear directional tear characteristics in a direction parallel to the orientation direction comprising:
    a first layer comprising 35-97 wt % propylene-based random copolymer, and 3.0-65 wt % low density ethylene homopolymer, wherein the first layer is heat sealable and monoaxially oriented at least 2.5 times in one direction; and
    a gas barrier layer on a side of the first layer.

2. The monoaxially oriented polyolefin film of claim 1, wherein the gas barrier layer comprises polyvinyl alcohol, ethylene vinyl alcohol, polyhydroxyaminoethers, polyvinyl butyrate, or polyvinyl amine.

3. The monoaxially oriented polyolefin film of claim 1, wherein the gas barrier layer comprises a blend of polyvinyl alcohol, ethylene vinyl alcohol and a crosslinking agent.

4. The monoaxially oriented polyolefin film of claim 1, wherein the first layer comprises a tie-resin.

5. The film monoaxially oriented polyolefin of claim 4, wherein the tie-resin comprises a maleic anhydride-grafted propylene homopolymer, a maleic anhydride-grafted propylene copolymer, or an ethylene polar terpolymer.

6. The monoaxially oriented polyolefin film of claim 4, wherein the tie-resin comprises an ethylene-acrylic acid-maleic anhydride terpolymer.

7. The monoaxially oriented polyolefin film of claim 1, further comprising a tie layer comprising a tie-resin between the first layer and the gas barrier layer.

8. The monoaxially oriented polyolefin film of claim 7, wherein the tie-resin comprises a maleic anhydride-grafted propylene homopolymer, a maleic anhydride-grafted propylene copolymer, or an ethylene polar terpolymer.

9. The monoaxially oriented polyolefin film of claim 7, wherein the tie-resin comprises an ethylene-acrylic acid-maleic anhydride terpolymer.

10. The monoaxially oriented polyolefin film of claim 7, wherein the tie-resin comprises polyethyleneimine.

11. The monoaxially oriented polyolefin film of claim 4, further comprising a tie layer comprising a tie-resin between the first layer and the gas barrier layer.

12. The monoaxially oriented polyolefin film of claim 1, further comprising a metal layer on of the gas barrier layer.

13. The monoaxially oriented polyolefin film of claim 12, wherein the metal layer has an optical density of 1.5-5.0.

14. A monoaxially oriented polyolefin film that exhibits excellent linear directional tear characteristics in a direction parallel to the orientation direction comprising:

a first layer comprising 35-97 wt % propylene-based random copolymer, and 3.0-65 wt % low density ethylene homopolymer, wherein the first layer is heat sealable and monoaxially oriented at least 2.5 times in one direction;

a gas barrier layer; and a tie layer comprising a tie-resin between the first layer and the gas barrier layer.

15. The monoaxially oriented polyolefin film of claim 14, wherein the first layer comprises a tie-resin.

16. The monoaxially oriented polyolefin film of claim 14, wherein the tie-resin comprises a maleic anhydride-grafted propylene homopolymer, a maleic anhydride-grafted propylene copolymer, or an ethylene polar terpolymer.

17. The monoaxially oriented polyolefin film of claim 14, wherein the tie-resin comprises a maleic anhydride-grafted propylene homopolymer, a maleic anhydride-grafted propylene copolymer, or an ethylene polar terpolymer.

18. The film of claim 14, wherein the tie-resin comprises an ethylene-acrylic acid-maleic anhydride terpolymer.

19. The film of claim 14, wherein the tie-resin comprises polyethyleneimine.

20. The monoaxially oriented polyolefin film of claim 1, wherein the gas barrier layer comprises polyvinyl alcohol, ethylene vinyl alcohol, polyhydroxyaminoethers, polyvinyl butyrate, or polyvinyl amine.

21. The monoaxially oriented polyolefin film of claim 1, wherein the gas barrier layer comprises a blend of polyvinyl alcohol, ethylene vinyl alcohol and a crosslinking agent.

* * * * *